US012733340B2

(12) United States Patent
Zhao et al.

(10) Patent No.: US 12,733,340 B2
(45) Date of Patent: Sep. 8, 2026

(54) TANDEM OLED STRUCTURE WITH PATTERNED INTERMEDIATE LAYERS

(71) Applicant: eMagin Corporation, Hopewell Junction, NY (US)

(72) Inventors: Fangchao Zhao, Hopewell Junction, NY (US); Howard Lin, Hopewell Junction, NY (US); Ilyas I. Khayrullin, Hopewell Junction, NY (US); Kerry Tice, Hopewell Junction, NY (US); Timothy Considine, Hopewell Junction, NY (US); Laurie Sziklas, Hopewell Junction, NY (US); Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 421 days.

(21) Appl. No.: 18/378,487

(22) Filed: Oct. 10, 2023

(65) Prior Publication Data

US 2024/0130160 A1 Apr. 18, 2024

Related U.S. Application Data

(60) Provisional application No. 63/415,888, filed on Oct. 13, 2022.

(51) Int. Cl.
*H10K 59/121* (2023.01)
*H10K 50/19* (2023.01)
(Continued)

(52) U.S. Cl.
CPC .......... *H10K 59/121* (2023.02); *H10K 50/19* (2023.02); *H10K 59/1201* (2023.02); *H10K 2102/351* (2023.02)

(58) Field of Classification Search
CPC .. H10K 59/121; H10K 59/1201; H10K 50/19; H10K 2102/351
See application file for complete search history.

(56) References Cited

U.S. PATENT DOCUMENTS 6,107,734 A 8/2000 Tanaka et al.
6,337,492 B1 1/2002 Jones et al.
(Continued)

FOREIGN PATENT DOCUMENTS

JP 2003-045676 A 2/2003

OTHER PUBLICATIONS

"Role of the Charge Generation Layer in Tandem Organic Light-Emitting Diodes Investigated by Time-Resolved Electroluminescence Spectroscopy" J. Phys. Chem. C 2011, 115, 582-588 (Year: 2011).*
(Continued)

*Primary Examiner* — Anne M Hines
(74) *Attorney, Agent, or Firm* — Kaplan Breyer Schwarz, LLP

(57) ABSTRACT

A tandem OLED display is provided, including a substrate backplane, an anode layer, at least two stacked OLED layers, each OLED layer comprising a plurality of pixels, at least one charge generation layer (CGL), wherein each CGL is disposed between two adjacent stacked OLED layers, and a cathode layer. At least one of the CGLs is patterned wherein a pattern provides gaps between each of the plurality of pixels.

15 Claims, 2 Drawing Sheets

(51) Int. Cl.

| | |
|---|---|
| ***H10K 59/12*** | (2023.01) |
| *H10K 102/00* | (2023.01) |

(56) References Cited

U.S. PATENT DOCUMENTS

| | | | | |
|---|---|---|---|---|
| 6,717,358 | B1 | 4/2004 | Liao et al. | |
| 7,821,201 | B2 | 10/2010 | Hatwar et al. | |
| 8,283,054 | B2 | 10/2012 | Spindler et al. | |
| 2003/0170491 | A1 | 9/2003 | Liao et al. | |
| 2003/0189401 | A1 | 10/2003 | Kido et al. | |
| 2016/0308132 | A1 | 10/2016 | Chan et al. | |
| 2018/0166512 | A1* | 6/2018 | Hack | H10H 20/80 |
| 2018/0254422 | A1 | 9/2018 | Wang et al. | |

OTHER PUBLICATIONS

International Search Report & Written Opinion issued on Mar. 8, 2024 in PCT Patent Application PCT/US2023/035017.

* cited by examiner 200
260
Cathode
Current
Flow
OLED-2
250
CGL
240
OLED-1
230
Pixel 1
Pixel 2
Pixel 3
Anode
Anode
Anode
210
Substrate/Backplane 10
22
Cathode
Current
Flow
24
OLED-2
20
CGL
18
OLED-1
16
Pixel 1
28
Pixel 2
30
32
Pixel 3
Anode
Anode
Anode
14
12
Substrate/Backplane 50
62
Cathode
Current
Flow
OLED-2
60
CGL
58
OLED-1
56
Pixel 1
Pixel 2
Pixel 3
Anode
Anode
Anode
54
52
Substrate/Backplane
V

TANDEM OLED STRUCTURE WITH PATTERNED INTERMEDIATE LAYERS

CROSS-REFERENCE TO RELATED APPLICATION

This application claims priority to U.S. Provisional Patent Application Ser. No. 63/415,888, filed Oct. 13, 2022, entitled Tandem OLED Structure with Patterned Intermediate Layers.

BACKGROUND OF THE INVENTION

The present invention relates to tandem OLED devices. More particularly, the present invention is directed to tandem OLED devices with a patterned intermediate layer.

An organic light-emitting diode device (OLED) commonly includes an anode, a cathode, and an organic electroluminescent layer sandwiched between the anode and the cathode. The organic electroluminescent layer commonly includes a hole-transporting layer, a light-emitting layer, and an electron-transporting layer. OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211. OLEDs can emit different colors, such as red, green, blue, or white, depending on the emitting property of its light emitting layer.

A "tandem" OLED is fabricated by stacking multiple individual OLED units vertically and driving the stack using a single power source. A tandem OLED structure (sometimes called a stacked OLED or a cascaded OLED) has been disclosed by Jones et al. in U.S. Pat. No. 6,337,492, Tanaka et al., in U.S. Pat. No. 6,107,734, Kido et al., in JP Patent Publication 2003/045676A and in U.S. Published Patent Application No. 2003/0189401 A1, and Liao et al. in U.S. Pat. No. 6,717,358 and U.S. Patent Application Publication No. 2003/0170491 A1. Tandem OLEDs, as compared with conventional OLEDs, have received broad attention owing to their superior current efficiency, brightness, and operational lifetime. In tandem OLEDs, several individual electroluminescent (EL) units are electrically connected in series via connecting stacks (sometime referred to as connecting electrodes) which function as charge generation layer (CGL), where holes and electrons are generated and injected into the adjacent hole transporting layers (HTL) and electron transporting layers (ETL), respectively. In principle, the device characteristics such as voltage, luminance, and current efficiency scale linearly with the number of EL units for tandem device with an efficient CGL.

With increased current efficiency, brightness and operational lifetime, a tandem structure is an important architecture for fabricating high performance OLED devices. The key element in making a high performance tandem OLED device is the CGL connecting OLED units, which plays an important role in charge generation and charge injection. High performance CGLs have been developed in recent years, and typically include high charge mobility (p/n doped) materials and/or even thin metal film See, for example, U.S. Pat. Nos. 8,283,054 and 7,821,201.

FIG. 1 illustrates a prior art, conventional tandem OLED sub-pixel 100 including a backplane substrate 110, an anode layer 120, a first organic emission layer 130, an n-type doped semiconductor layer 140, a p-type doped semiconductor layer 150, a second organic emission layer 160, and a cathode layer 170. N-type doped semiconductor layer and p-type doped semiconductor layer form the CGL between the first and second organic emission layers 130 and 160, respectively.

The CGL plays an essential role in the tandem OLED performance, which is composed of the n-doped semiconductor layer and the p-doped semiconductor layer junction for injection of electrons and holes, respectively. At an initial stage of device operation, free electrons and holes are supplied from the CGL. At a subsequent stage, when a bias is applied to the device, these free electrons and holes in the CGL can transport and inject into their adjacent EL units; while electrons and holes from the cathode and anode also inject into the EL units, respectively. Thereafter, bipolar currents gradually reach a steady state.

With the highly conductive CGL as a common layer in a tandem OLED display, lateral current leakage is an issue, especially when the gap between pixels is small in high resolution displays. FIG. 2 depicts prior art tandem OLED display having a substrate backplane 210, an anode layer 220, an OLED-1 layer 230, a CGL 240, an OLED-2 layer 250, and a cathode layer 260. As shown in FIG. 1, when pixel 1 is on, lateral current can leak to adjacent pixels (pixel 2, pixel 3) through the CGL 240, causing emission crosstalk due to undesired emission from OLED-2 250. This is especially severe in the case of doped transport layer materials. It would be highly desirable to prevent this lateral current leakage and emission crosstalk.

All references cited herein are fully incorporated by reference in their entireties.

SUMMARY OF THE INVENTION

It should be appreciated that this Summary is provided to introduce a selection of concepts in a simplified form that are further described below in the Detailed Description. The Summary is not intended to be used to limit the scope of the claimed subject matter.

In a first exemplary embodiment of the present invention, a tandem OLED display is provided which includes a substrate backplane, an anode layer, at least two stacked OLED layers, each OLED layer having a plurality of pixels, at least one charge generation layer (CGL), wherein each CGL is disposed between two adjacent stacked OLED layers, and a cathode layer. At least one of the CGLs is patterned wherein a pattern provides gaps between each of the plurality of pixels.

The patterned CGL may be manufactured from an organic material. Alternatively, the patterned CGL may be manufactured from a metal. The patterned CGL may be processed in high vacuum by thermal expansion. The patterned CGL may have at least two layers. A thickness of the patterned CGL dimension may range from, for example, about 0.5 um to 50 um. The gaps in the CGL layers may range from, for example, 0.2 um to 50 um.

The anode layer may also be patterned with gaps between each of the plurality of pixels. The cathode layer may also be patterned with gaps between each of the plurality of pixels. At least one of the OLED layers may be patterned with gaps between each of the plurality of pixels.

In a s second exemplary embodiment of the present invention, a tandem OLED display is provided which includes a substrate backplane, an anode layer, at least two stacked OLED layers, each OLED layer comprising a plurality of pixels, at least one charge generation layer, wherein each CGL is disposed between two adjacent stacked OLED layers, and a cathode layer. At least one of the CGLs is patterned wherein a pattern provides gaps between each of the plurality of pixels. The anode layer is patterned with gaps between each of the plurality of pixels, the cathode layer is patterned with gaps between each of the plurality of pixels, and at least one of the OLED layers is patterned with gaps between each of the plurality of pixels.

The patterned CGL may be manufactured from an organic material. Alternatively, the patterned CGL may be manufactured from a metal. The patterned CGL may be processed in high vacuum by thermal expansion. The patterned CGL may include at least two layers. A thickness of the patterned CGL dimension may range from, for example, about 0.5 um to 50 um. The gaps in the CGL layer may range from, for example, 0.2 um to 50 um.

BRIEF DESCRIPTION OF THE DRAWINGS

The embodiments of the invention will be better understood with the following detailed description with reference to the drawings, which are not necessarily drawn to scale, and in which.

DETAILED DESCRIPTION

Figure 1:
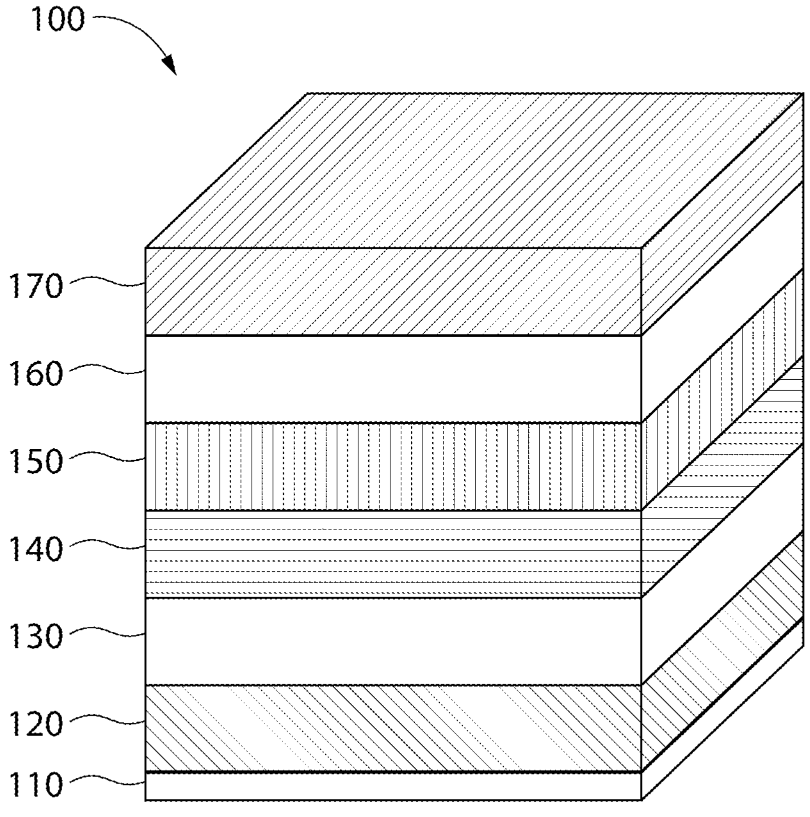
FIG. 1 depicts a prior art, conventional OLED sub-pixel, including a CGL.
Figures 2, 3, 4:
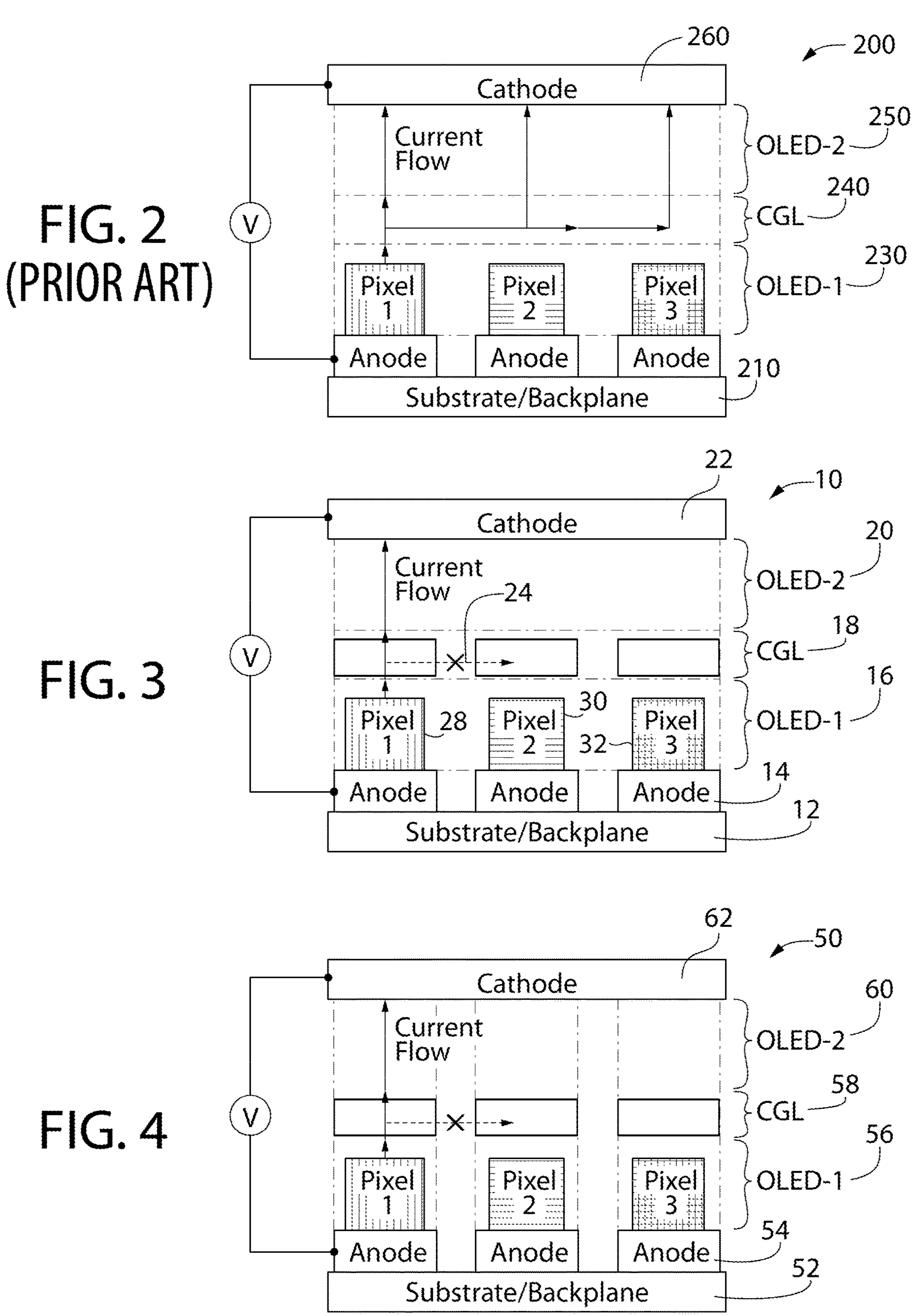
FIG. 2 is a simplified block diagram of a prior art, convention tandem OLED display with a common CGL.
FIG. 3 is a simplified block diagram of a tandem OLED display with a patterned CGL in accordance with an exemplary embodiment of the present invention.
FIG. 4 is a simplified block diagram of a tandem OLED display with a patterned CGL and other layers in accordance with another exemplary embodiment of the present invention.

Referring now to the drawing figures wherein like reference numbers refer to like elements throughout the several views, there is shown in FIG. 3, a tandem OLED display with patterned intermediate layers 10 in accordance with an exemplary embodiment of the present invention.

The tandem OLED display 10 includes a substrate backplane 12, an anode layer 14, an OLED-1 layer 16, a CGL 18, an OLED-2 layer 20, and a cathode layer 22. In accordance with an exemplary embodiment of the present invention, the CGL 18 is patterned/for each individual pixel with gaps 24, 26 between active pixels 28, 30, 32.

The patterned CGL 18 may be, for example, an organic material or a metal. The CGL 12 patterning may be processed, for example, in high vacuum by thermal evaporation, as known. The patterned CGL 18 may be one layer, or it may be more than one layer. The patterned CGL 18 may be, for example, 0.5 μm to 50 μm thick. A gap between the patterned CGL 18 and adjacent layers may be, for example, 0.2 μm to 50 μm.

In an alternative embodiment of the present invention as shown in FIG. 4, a tandem OLED display 50 is shown which includes a substrate backplane 52, an anode layer 54, an OLED-1 layer 56, a CGL 58, an OLED-2 layer 60, and a cathode layer 62. In this tandem OLED display 50, with the exception of the CGL 58, the anode layer 54, the OLED-1 layer 56, and the OLED-2 layer 58 may be layered in a similar fashion to the CGL 58. This provides additional prevention of lateral current leakage and emission crosstalk. Q The present device applies to both white OLEDs with color filters as well as directly patterned OLEDs.

The present invention provides numerous advantages over the prior art. First, as noted above, the tandem OLED display with patterned CGL 10 would substantially reduce lateral current leakage and crosstalk in the display 10. Moreover, the display 10 of the present invention offers high resolution, high efficiency, and long operational lifetime It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A tandem OLED display comprising:
(a) a substrate backplane
(b) an anode layer
(c) at least two stacked OLED layers, each OLED layer comprising a plurality of pixels;
(d) at least one charge generation layer (CGL), wherein each CGL is disposed between two adjacent stacked OLED layers;
(e) a cathode layer;
(f) wherein at least one of the CGLs is patterned wherein a pattern provides gaps between each of the plurality of pixels; and
(g) wherein a thickness of the patterned CGL dimension ranges from about 0.5 um to 50 um.

2. The tandem OLED display of claim 1, wherein the patterned CGL is manufactured from an organic material.

3. The tandem OLED display of claim 1, wherein the patterned CGL is manufactured from a metal.

4. The tandem OLED display of claim 1, wherein the patterned CGL is processed in high vacuum by thermal expansion.

5. The tandem OLED display of claim 1, wherein the patterned CGL comprises at least two layers.

6. The tandem OLED display of claim 1, wherein, the anode layer is patterned with gaps between each of the plurality of pixels.

7. The tandem OLED display of claim 1, wherein, the cathode layer is patterned with gaps between each of the plurality of pixels.

8. The tandem OLED display of claim 1, wherein, at least one of the OLED layers is patterned with gaps between each of the plurality of pixels.

9. A tandem OLED display comprising:
(a) a substrate backplane
(b) an anode layer
(c) at least two stacked OLED layers, each OLED layer comprising a plurality of pixels;
(d) at least one charge generation layer (CGL), wherein each CGL is disposed between two adjacent stacked OLED layers;
(e) a cathode layer; and
(f) wherein at least one of the CGLs is patterned wherein a pattern provides gaps between each of the plurality of pixels, wherein the gaps in the CGL layer range from 0.2 um to 50 um.

10. A tandem OLED display comprising:
(a) a substrate backplane
(b) an anode layer
(c) at least two stacked OLED layers, each OLED layer comprising a plurality of pixels;
(d) at least one charge generation layer (CGL), wherein each CGL is disposed between two adjacent stacked OLED layers;
(e) a cathode layer;

(f) wherein at least one of the CGLs is patterned wherein a pattern provides gaps between each of the plurality of pixels;

(g) wherein, the anode layer is patterned with gaps between each of the plurality of pixels;

(h) wherein, the cathode layer is patterned with gaps between each of the plurality of pixels;

(i) wherein, at least one of the OLED layers is patterned with gaps between each of the plurality of pixels; and wherein a thickness of the patterned CGL dimension ranges from about 0.5 um to 50 um.

11. The tandem OLED display of claim 10, wherein the patterned CGL is manufactured from an organic material.

12. The tandem OLED display of claim 10, wherein the patterned CGL is manufactured from a metal.

13. The tandem OLED display of claim 10, wherein the patterned CGL is processed in high vacuum by thermal expansion.

14. The tandem OLED display of claim 10, wherein the patterned CGL comprises at least two layers.

15. A tandem OLED display comprising:

(a) a substrate backplane (b) an anode layer (c) at least two stacked OLED layers, each OLED layer comprising a plurality of pixels;

(d) at least one charge generation layer (CGL), wherein each CGL is disposed between two adjacent stacked OLED layers;

(e) a cathode layer;

(f) wherein at least one of the CGLs is patterned wherein a pattern provides gaps between each of the plurality of pixels;

(g) wherein, the anode layer is patterned with gaps between each of the plurality of pixels;

(h) wherein, the cathode layer is patterned with gaps between each of the plurality of pixels; and (i) wherein, at least one of the OLED layers is patterned with gaps between each of the plurality of pixels, wherein the gaps in the CGL layer range from 0.2 um to 50 um.

* * * * *